United States Patent
Böke et al.

(10) Patent No.: US 11,509,300 B2
(45) Date of Patent: Nov. 22, 2022

(54) SWITCH MODULE FOR AN ELECTRONIC SWITCH

(71) Applicant: Siemens Aktiengesellschaft, Munich (DE)

(72) Inventors: Willi Böke, Lauf (DE); Markus Matthias Gaudenz, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/429,893

(22) PCT Filed: Jan. 12, 2020

(86) PCT No.: PCT/EP2020/053526
§ 371 (c)(1),
(2) Date: Aug. 10, 2021

(87) PCT Pub. No.: WO2020/165202
PCT Pub. Date: Aug. 20, 2020

(65) Prior Publication Data
US 2022/0094347 A1 Mar. 24, 2022

(30) Foreign Application Priority Data
Feb. 14, 2019 (EP) .................... 19157154

(51) Int. Cl.
*H03K 17/082* (2006.01)
(52) U.S. Cl.
CPC ... *H03K 17/082* (2013.01); *H03K 2217/0027* (2013.01)
(58) Field of Classification Search
CPC ........ H03K 17/082; H03K 2217/0027; H02M 1/088; H02M 1/1584
See application file for complete search history.

(56) References Cited

U.S. PATENT DOCUMENTS 6,373,318 B1* 4/2002 Dohnke .............. H01L 29/1608
257/E27.059
9,837,906 B1* 12/2017 Childs ................. H02M 3/1584
(Continued)

FOREIGN PATENT DOCUMENTS

EP  2 445 110 A1  4/2012
WO  WO 2019-011642 A1  1/2019

OTHER PUBLICATIONS

Hofer Parick et al.:; "Paralleling intelligent IGBT power modules with active gate-controlled current balancing"; Power Electronics Specialists Conference; 27th Annual IEEE; XP002619276; ISBN: 978-0-7803-3501-1; URL:http://ieeexplore.ieee.org/stamp/stamp.jsp?tp=&arnumber=548751&tag=1; 1996.
(Continued)

*Primary Examiner* — Scott Bauer
(74) *Attorney, Agent, or Firm* — Henry M. Feiereisen LLC

(57) ABSTRACT

An electronic switch includes switching modules to change a forward resistance of a semiconductor switch via a drive circuit depending on data exchanged via a data interface and depending on measurement values of a current sensor. The semiconductor switches of the switching modules are arranged electrically in parallel and a current through the electronic switch is divided among the semiconductor switches. The electronic switch controls a division of the current through the electronic switch among the semiconductor switches via the drive circuits by changing a forward resistance of the semiconductor switches, synchronously switches the semiconductor switches via the drive circuit and operates the semiconductor switches in a linear region in a time range of 1 μs to 10 μs upon a change between ON and OFF and a change between OFF and ON in such a way (Continued)

that the current through the switching modules is reduced in a controlled manner.

12 Claims, 2 Drawing Sheets

(56) References Cited

U.S. PATENT DOCUMENTS

| | | |
|---|---|---|
| 2006/0193091 A1 | 8/2006 | Joukou et al. |
| 2006/0267721 A1* | 11/2006 | Graf ................. H01C 7/126 337/297 |
| 2008/0129261 A1* | 6/2008 | Oelmaier ............ G05F 1/56 323/273 |
| 2012/0098577 A1 | 4/2012 | Lobsiger et al. |
| 2017/0054439 A1 | 2/2017 | Sasaki |
| 2021/0091561 A1 | 3/2021 | Schierling et al. |
| 2021/0119273 A1* | 4/2021 | Taniguchi ........ H01M 10/441 |

OTHER PUBLICATIONS

PCT International Search Report and Written Opinion of International Searching Authority dated Feb. 12, 2020.

* cited by examiner

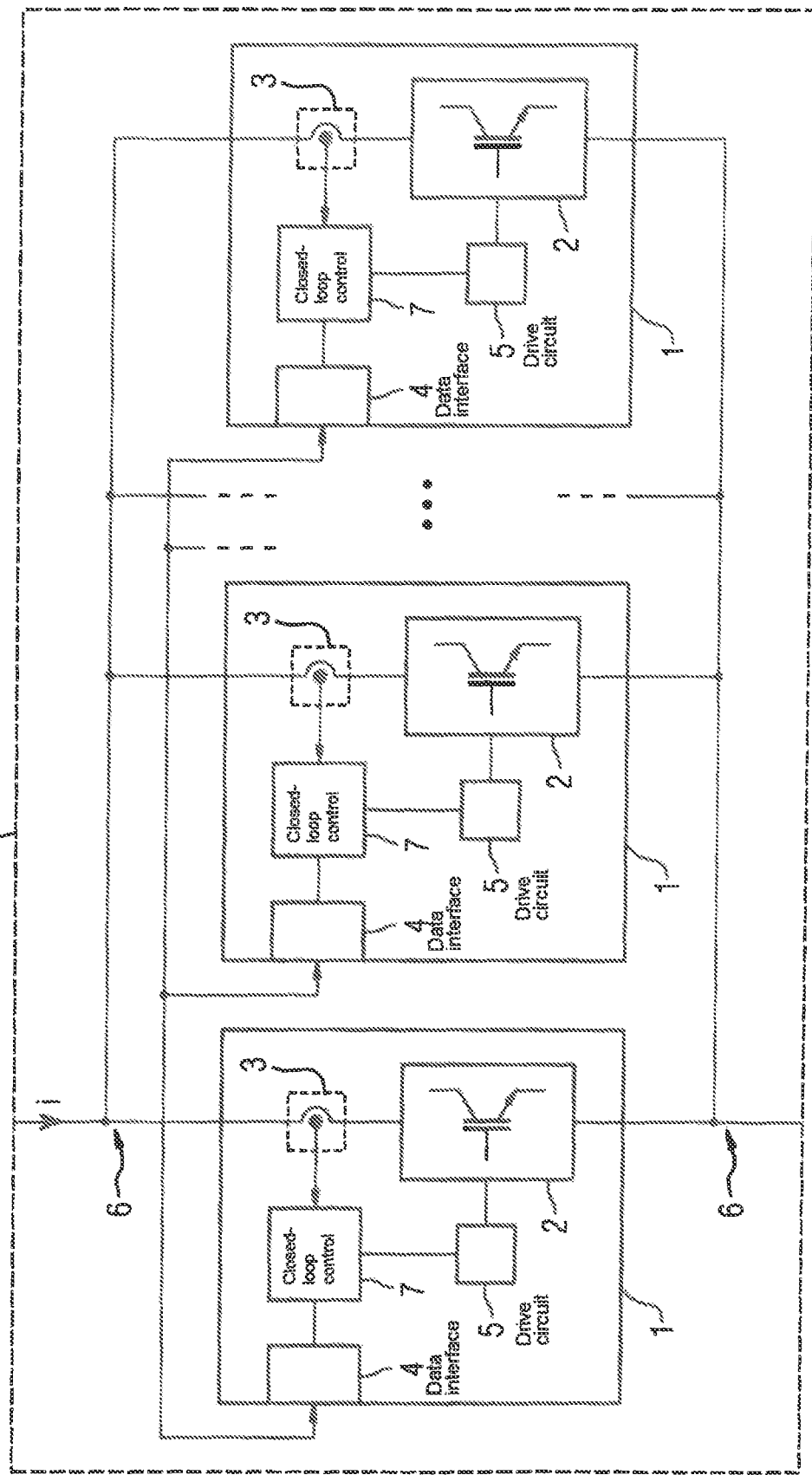

SWITCH MODULE FOR AN ELECTRONIC SWITCH

CROSS-REFERENCES TO RELATED APPLICATIONS

This application is the U.S. National Stage of International Application No. PCT/EP2020/053526, filed Feb. 12, 2020, which designated the United States and has been published as International Publication No. WO 2020/165202 A1 and which claims the Feb. 14, 2019 13, 2006, pursuant to 35 U.S.C. 119(a)-(d).

BACKGROUND OF THE INVENTION

The invention relates to a switching module for an electronic switch, and to an electronic switch. Furthermore, the invention relates to a method for operating an electronic switch of this type.

A switch is also referred to by the term switching devices. Switches for high currents, in particular mechanical switches, are more complex to produce, precisely when DC voltage switches are involved. On account of the small numbers produced, which decrease with the level of the current to be switched, these switches for high currents are correspondingly more than proportionally more expensive in comparison with smaller implementations. In this case, switches nowadays are primarily designed in regard to the load to be switched.

Besides mechanical switches, electronic switches are known as well. An electronic switch comprises a semiconductor switch that carries or interrupts the current through the electronic switch. These electronic switches are able to switch rapidly.

Large currents can be managed by connecting mechanical switches in parallel, for example by the operational switching of contactors. However, this parallel operation is not possible without further measures nowadays. In this regard, additional protective relays (measuring devices and monitoring arrangements) are then used for the protection function and they then control the switching devices. When mechanical switches are connected in parallel, it is necessary accordingly to take account of deductions (10% to 30%) for possible asymmetries in the current distribution. A parallel connection over and above two mechanical switches is no longer expedient on account of the large deductions. In addition, it is necessary to use complex designs for the interconnection of the current paths, since small switching devices cannot accommodate the cross section required for the summation current. The individual conductor feeds likewise have to be embodied very symmetrically in order that the current division is effected uniformity. At the same time, stringent requirements in respect of synchronous switching have to be satisfied in order to avoid overloads at one of the parallel switches during a switching action.

Semiconductors have a forward resistance. That is an electrical resistance between the switching terminals of the semiconductor. If a current flows through the semiconductor, then a voltage drop across the switching terminals arises on account of the forward resistance, inter alia. At the same time, depending on the current, losses arise in the semiconductor on account of the forward resistance.

The task of the electronic switch is to electrically isolate the at least two terminals present from one another by means of one or more semiconductor switches in order to prevent a current flow, or to electrically connect them to one another in order to enable a current flow. Examples of the realization of an electronic switch of this type are specified in WO2019/011642A1. The electronic switch should not be confused with a switching element of a power converter. Semiconductors are also used there as switching elements, said semiconductors being required to generate a predefinable voltage. However, such a switching element of a power converter is not readily usable as an electronic switch.

The performance of a switch is measured by what current the switch can switch. The greater the switchable current, the greater the performance of the switch. It is also stated in this respect that the switch capacity of the switch is greater.

A switch, in particular an electronic switch, has the task of creating or interrupting a conducting connection. In this case, in an ON state, also referred to as switched-on state or conducting state, a conducting connection is created, while in the OFF state, also referred to as switched-off state or nonconducting state, the input and output terminals of the switch are electrically insulated from one another. The switchover between ON and OFF states is effected by the movement of a current-conducting element in the mechanical switch, and by the driving of one or more semiconductors in the electronic switch.

The invention is based on the object of improving an electronic switch.

SUMMARY OF THE INVENTION

This object is achieved by means of a switching module for an electronic switch, comprising a semiconductor switch with a drive circuit, a current sensor and a data interface for connecting to a further switching module, wherein the forward resistance of the semiconductor switch is changeable by means of the drive circuit depending on data exchanged via the data interface and/or depending on measurement values of the current sensor. Furthermore, this object is achieved by means of an electronic switch comprising at least two switching modules of this type, wherein the switching modules are arranged in parallel in such a way that the semiconductor switches are arranged electrically in parallel and that a current through the electronic switch is divided among the semiconductor switches of the switching modules, wherein the data interfaces of the respective switching modules are connected to one another, wherein a division of the current through the electronic switch among the semiconductor switches is able to be influenced, in particular is able to be controlled by open-loop and/or closed-loop control, by means of the drive circuits by changing the respective forward resistance of the semiconductor switches. This object is furthermore achieved by means of a method for operating an electronic switch of this type, wherein depending on data exchanged via the data interface and/or depending on measurement values of the current sensors, the forward resistance of the semiconductor switches is controlled by open-loop or closed-loop control in such a way that the current through the electronic switch is divided among the semiconductor switches in such a way that the respective semiconductor switches maximally carry the respectively permissible current.

Further advantageous configurations of the invention are specified in the dependent claims.

The invention is based on the insight that an electronic switch can be produced particularly advantageously if it is constructed modularly. In the modular construction, the electronic switch is composed of a parallel connection of switching modules, wherein each switching module comprises a semiconductor switch. In this case, the current through the electronic switch is divided among the parallel semiconductor switches.

In this case, the semiconductor switch can comprise one or more semiconductors. The respective semiconductor in turn comprises a switching element and, depending on whether it is of reverse conducting or blocking design, optionally comprises a diode arranged in antiparallel with the element to be switched.

In this case, it is particularly advantageous, in the switched-on state of the switching module, to change the forward resistance of the semiconductor switch by means of the drive circuit depending on data exchanged via the data interface and/or depending on measurement values of the current sensor, since it is precisely in the steady state that an unequal current distribution can arise in an electronic switch with a plurality of parallel switching modules.

In this case, the variation of the forward resistance can either depend on data that are exchanged via the interface. By way of example, a superordinate closed-loop control can transmit to the individual switching modules data regarding the level at which the forward resistance should be set. Alternatively, the variation of the forward resistance can also be effected depending on the current measurement value. In this regard, for example, a stored characteristic curve can stipulate the level of the forward resistance to be set depending on the current through the switching module. By this means, too, it is possible to achieve a good and uniform division of the current through the electronic switch among the switching modules. Furthermore, it is also possible and advantageous to carry out the variation depending both on data exchanged via the data interface and on the current measurement value. By way of example, current measurement values of other switching modules can be transmitted as values via the data interface. If both the current values of parallel switching modules and the current value through the present switching module are known, it is possible to realize a definable current division in conjunction with low forward resistances in a particularly simple manner. In particular, a uniform division of the current through the electronic switch among the parallel switching modules can be effected particularly simply since the controlled variable and thus the control deviation are known to each switching module.

The number of identical parts, such as switching modules of identical type or components of identical type in the switching modules, such as a data interface or the drive circuit, for example, is large and it is thus possible to produce electronic switches with varying performance capabilities in a simple manner. Varying numbers of switching modules are connected in parallel for this purpose. Especially even electronic switches with large switching currents can be realized cost-effectively by means of the modularly constructed electronic switch.

The parallel connection of switching modules and thus the parallel connection of semiconductor switches is made possible, inter alia, by a data interface of the switching modules. The switching modules arranged in parallel exchange information about their module state via said data interface. This can be for example information about a measured current, information concerning a limit value being exceeded, in particular the current permissible for the semiconductor switch being exceeded, information about the capacity utilization of the semiconductor switch or about power loss of the semiconductor switch. This information is used to influence the division of the current through the electronic switch among the semiconductor switches arranged in parallel. Besides the item or items of information of the switching modules arranged in parallel, the current measurement value of the particular switching module can also be used for this purpose. The division of the current of the electronic switch is effected by the drive circuits of the respective switching modules, which changes the forward resistance of the individual semiconductor switches and thus also influences the division of the current among the individual switching modules. The division of the current among the individual switching modules is thus able to be controlled by open-loop or closed-loop control by means of the drive circuit.

Various criteria can be applied for the division of the current. The closed-loop control or open-loop control ensures that the division is effected in such a way that none of the semiconductor switches arranged in parallel is loaded with an impermissibly high current. In other words, the division is controlled by closed-loop control or open-loop control such that the current through the semiconductor switch maximally assumes the maximum value permissible for this semiconductor switch and the semiconductor switch is not overloaded. This current can be predefined, for example from a data sheet of the semiconductor switch, or calculated continuously with the aid of a model, this incorporating for example the power loss or the temperature of the semiconductor switch. Furthermore, it has proved to be advantageous for the current to be divided uniformly among the parallel semiconductor switches. This is advantageous particularly if the switching modules are embodied structurally identically. The uniform division then also corresponds to a uniform loading of the switching modules. A corresponding closed-loop control can be realized in a simple manner by means of the current sensor. Alternatively, it is possible to divide the current in such a way that the power loss in the individual switching modules is identical. This means that the heat that arises is also distributed uniformly over the switching modules and can be dissipated to the surroundings in a simple manner. The risk of heating concentrated at points, which can result in damage or shortening of the lifetime of individual switching modules, can be avoided by means of the uniform power loss.

The deviations on account of differences in the individual semiconductor switches arranged in parallel and the differences in the line resistances, for example as a result of an asymmetrical construction of the wiring, can be corrected by the open-loop control of the on-state behavior of the individual semiconductor switches. A corresponding closed-loop control or open-loop control then results in the desired division of the current among the individual switching modules. This means that no asymmetries arise in the current division, and so there is no need to make any deductions in the dimensioning of the parallel connection of the switching modules of the electronic switch. By means of the measurement of the currents and the intervention of the closed-loop control or open-loop control on the on-state behavior, various embodiments with a plurality of switching modules can be connected in parallel as well. It is thus possible to produce a modular electronic switch with virtually arbitrary switching currents from the parallel connection of switching modules in a particularly simple manner. In order to cover a high bandwidth of switching currents, this necessitates only one or at least a few switching modules with varying performance of the semiconductor switch.

If a fault is present, the semiconductor switches arranged in parallel can be turned off synchronously by means of the drive circuit in order to prevent an overloading of one or more switching modules. In this case, it may be advantageous to provide a third state between the two switching states ON and OFF of the switch. In which third state, upon a change between ON and OFF and also a change between OFF and ON, the switch is operated in the linear region for a short period, i.e. in the time range of up to 1 ms. As a result, the divided current through the individual switching modules can be reduced in a controlled manner or built up in a controlled manner. An overloading, caused by a changed current division on account of temporally offset switching of the individual semiconductor switches arranged in parallel, is thus reliably avoided. In this case, a duration of 1 µs to 10 µs has proved to be particularly advantageous in order to avoid an overloading of individual semiconductor switches arranged in parallel and at the same time to keep lossy operation in the linear region as short as possible.

By comparison with a parallel connection of electromechanical switching devices, in the case of the electronic switch on the basis of switching modules arranged in parallel, by means of the continuous influencing of the on-state behavior of the individual semiconductor switches, it is possible to achieve an advantageous utilization and even a maximum utilization of all switching modules connected in parallel. This is possible for the first time for applications with protection functions. Since the individual switching modules are utilized well in terms of their performance on account of the current division among the individual switching modules that is controllable by open-loop and/or closed-loop control, electronic switches with high switching currents are able to be produced particularly cost-effectively. The costs of a parallel connection of devices can be reduced by the high utilization of the switching modules. In this case, these individual switching modules can be connected in parallel in any desired way, such that an electronic switch covering a large power range can be modularly constructed therefrom. The proportion of identical parts is particularly high and at the same time the switch is scalable particularly well. This makes the modular electronic switch particularly cost-effective in regard to production, stock keeping, spare parts business, etc.

By actively influencing the on-state behavior (for example by means of the gate voltage), it is possible for the total current to be divided among the individual switching modules in a manner controlled by open-loop or closed-loop control. Consequently, each switching module can be utilized up to its loading limit.

In one advantageous configuration of the invention, the semiconductor switch is designed in such a way as to be able to turn off a current independently of the current flow direction through the switching module. For the case where the semiconductors of the semiconductor switch are reverse conducting, the semiconductor comprises a diode in parallel with its switching element, which diode can carry a current counter to the current direction through the switching element. The switching element and the diode are then arranged in antiparallel. In this case, the semiconductors of the semiconductor switch are arranged in a series connection in such a way that a current with a first current flow direction flows through the switching element of the first semiconductor and through the diode of the second semiconductor. An opposite current flows through the switching element of the second semiconductor switch and the diode of the first semiconductor switch.

For the case where the semiconductors are of reverse blocking design, that is to say can carry and turn off only one current in one direction, the semiconductors each comprise only a switching element. A diode in parallel with a switching element is not present. In order to be able to carry and turn off a current independently of the current flow direction through the switching module, the semiconductors are arranged in a parallel connection. In this case, the semiconductors are arranged in antiparallel with one another. That means that a current with a first current flow direction flows through the switching element of the first semiconductor and a current flowing through the switching module in the opposite current flow direction flows through the switching element of the second semiconductor.

The advantage of this arrangement is that even loads capable of feedback can be reliably disconnected from an energy source if it is possible to turn off the current in both current flow directions. Furthermore, an electronic switch of this type makes it possible for even different power distribution networks or power transmission networks to be connected to one another in a disconnectable manner.

In a further advantageous configuration of the invention, the switching modules are embodied structurally identically. Even electronic switches with large switching currents can be constructed cost-effectively on the basis of standardized switching modules. In this case, a plurality of electronic switches having varying performance can be produced from identical switching modules. These standardized switching modules can be produced in high numbers cost-effectively and with high quality. This results in great saving effects for the provision and stock keeping of electronic switches with varying switching currents and also enables even switches for high currents to be able to be offered economically. Many identical parts and the good scalability, low stock keeping costs, since it is not necessary to keep available various performance classes with various switches, lower the costs significantly for the modular electronic switch in comparison with a mechanical or nonnodular switch. If the switching modules are all embodied structurally identically, the number of identical parts increases further and thus results in cost-effective solutions on account of the increased quantitative effect.

In a further advantageous configuration of the invention, the switching modules differ in the performance of the respective semiconductor switches. By means of switching modules which each comprise semiconductor switches having a different performance, in particular a different current-carrying capacity, a wide performance spectrum of electronic switches having a different performance, i.e. having different currents, can be produced with a small number of switching modules arranged in parallel. Even if the semiconductor switches differ in their performance, the switching modules can still comprise a high proportion of identical parts since identical drive circuits and identical data interfaces can be used for different semiconductor switches as well. A good economic compromise between identical parts and required number of parallel switching modules is thus achieved. By means of the different performance of the switching modules, different performances, i.e. currents of different levels that can be turned off, can be achieved with a small number of switching modules arranged in parallel.

In a further advantageous configuration of the invention, a wiring for electrically connecting the switching modules is embodied asymmetrically. By virtue of the division of the current through the electronic switch among the parallel switching modules in a manner controlled by open-loop or closed-loop control, outlay for as symmetrical a wiring as possible can be obviated. Said symmetrical wiring is necessary in the case of a parallel connection of mechanical switches in order to counteract an unequal distribution in the division of the current among the individual parallel switches. Said symmetrical wiring is expensive and requires installation space. To put it another way, a symmetrical wiring can be dispensed with in the case of the parallel connection of switching modules. Material for the formation of the wiring, such as expensive copper, can be saved as a result. This furthermore also enables a higher degree of freedom in the spatial arrangement of the switching modules since this arrangement is not dependent on the symmetrical wiring. Consequently, the expenditure for a symmetrical wiring and also boundary conditions for the spatial arrangement of the switching modules are obviated since even these differences can be compensated for by means of open-loop control of the forward resistances of the semiconductor switches. Consequently, in combination with the switching module proposed, the electronic switch can be constructed particularly simply and cost-effectively.

In a further advantageous configuration of the invention, the division of the current among the semiconductor switches is controlled by open-loop or closed-loop control in such a way that the capacity utilization of the semiconductor switches, in particular a semiconductor current through the respective semiconductor switches, is identical. The capacity utilization is the ratio of the current that flows through the semiconductor switch and the permissible current through the semiconductor switch. In the case of structurally identical semiconductor switches, the identical capacity utilization should be equated with an identical current. By contrast, if one semiconductor switch has a permissible current of double the magnitude of that of another semiconductor switch, then with identical capacity utilization the current through said semiconductor switch is also double the magnitude of the current through the other semiconductor switch. As a result of the identical capacity utilization, the loading for the individual switching modules is kept as low and equal as possible, such that the lifetime of the electronic switch can be optimized from this operation. Furthermore, the information about the capacity utilization can be determined in a simple manner by normalizing the measurement value of the current sensor.

The term semiconductor current denotes the current through the semiconductor of the respective switching module.

In a further advantageous configuration of the invention, the parameters required for the division of current are determined and stored. In order that the desired current division is set rapidly and correctly by the open-loop or closed-loop control and no semiconductor switch is loaded too much during the switching process, which is only compensated for again by the closed-loop control, it has proved to be advantageous to determine and store parameters with which the current is already divided among the parallel switching modules virtually as desired. Said parameters take account of differences in the semiconductor switches of the different switching modules. Said parameters can then be used as a starting point for the initial switching of the electronic switch, since an optimized division of the current among the switching modules is thus already achieved. The exact division is then achieved by the action of the closed-loop control or open-loop control.

In this case, this initial measurement can be performed either in an automated manner or else manually by the commissioning personnel, for example. It is thus ensured that even in the case of extreme unequal distributions on account of component variations and/or an asymmetrical wiring, a sufficiently good current division already arises at the point in time of switching, in particular upon initial switching.

BRIEF DESCRIPTION OF THE DRAWING

The invention is explained and described in greater detail below on the basis of the exemplary embodiments illustrated in the figures, in which:

FIG. 2 shows an electronic switch comprising switching modules.

DETAILED DESCRIPTION OF PREFERRED EMBODIMENTS

Figure 1:
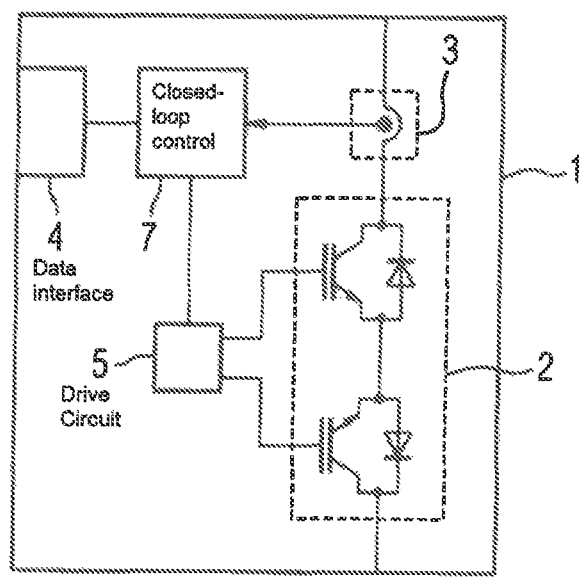
FIG. 1 shows a switching module.

FIG. 1 shows a switching module 1 suitable for use in a modular electronic switch 10. The switching module 1 comprises a semiconductor switch 2, a current sensor 3, a data interface 4, a drive circuit 5 and a closed-loop control 7. With the aid of the current sensor 3 and/or data that are able to be transmitted from other switching modules 1, arranged in parallel, via the data interface 4, the closed-loop control 7 controls the current through the switching module by open-loop or closed-loop control. In this case, the on-state behavior of the semiconductor switch 2, which behavior is able to be influenced by the drive circuit 5, serves as actuator. To that end, the closed-loop control 7 exchanges data with the data interface 4 and/or receives measurement values from the current sensor 3. The output of the closed-loop control 7 is connected to the drive circuit 5 in order to implement the closed-loop control task at the semiconductor switch 2.

FIG. 2 shows an electronic switch 10 constructed from a plurality of switching modules 1 arranged in parallel. Two or more switching modules 1 can be used to construct a modular electronic switch 10. The individual switching modules correspond for example to the exemplary embodiment from FIG. 1. They can be structurally identical or be different. By way of example, the switching modules 1 can differ in the performance of the semiconductor switch 2. It is thus possible to realize electronic switches 1 with different switching currents with only a small number of switching modules 1 arranged in parallel. Said switching modules 1 are connected to one another for data exchange via their data interface 4. In this case, the data interface 4 can be designed as a digital or analog data interface 4. By means of the transmitted data, the closed-loop controls 7 of the individual switching modules 1 can control the division of the current i among the individual switching modules by open-loop or closed-loop control. Various optimization criteria for the division of the current i can be used here. The closed-loop controls 7 ensure that an impermissibly high current does not flow through any switching module 1.

In this case, the wiring 6 of the electronic switch 10, said wiring connecting the semiconductor switches 2 of the switching modules 1 in parallel with one another, can be embodied such that it is asymmetrical, also referred to as nonsymmetrical. In this regard, for example, in the exemplary embodiment illustrated, the line length is the shortest for the connection of the switching module 1 on the left and increases with each switching module 1 from left to right.

As an alternative to the exemplary embodiments illustrated in FIGS. 1 and 2, it is also possible to provide a central closed-loop control for the electronic switch 10 instead of the individual closed-loop controls 7 of the respective switching modules 1. Likewise, the tasks of the closed-loop control 7 can alternatively be carried out by the drive circuit. The data exchange between the central closed-loop control and the drive circuits 5 can then also be effected via the data interface 4, for example.

In summary, the invention relates to a switching module and an electronic switch. In order to improve the electronic switch, it is proposed that the electronic switch comprises at least two switching modules. In this case, the switching modules comprise a semiconductor switch with a drive circuit, a current sensor and a data interface for connecting to a further switching module, wherein the forward resistance of the semiconductor switch is able to be changed by means of the drive circuit depending on data exchanged by the data interface and/or depending on measurement values of the current sensor. In the case of the electronic switch comprising at least two switching modules of this type, the switching modules are arranged in parallel with one another in such a way that the semiconductor switches are arranged electrically in parallel with one another and that a current through the electronic switch is divided among the semiconductor switches of the switching modules, wherein the data interfaces of the respective switching modules are connected to one another, wherein a division of the current through the electronic switch among the semiconductor switches is able to be influenced, in particular is able to be controlled by open-loop and/or closed loop control, by means of the drive circuits by changing the respective forward resistance of the semiconductor switches. The invention furthermore relates to a method for operating an electronic switch of this type.

To put it another way, the invention relates to a switching module for an electronic switch. In order to improve the switching module, it is proposed that the switching module comprises a semiconductor switch with a drive circuit, a current sensor and a data interface for connecting to a further switching module, wherein the switching module is configured to change the forward resistance of the semiconductor switch by means of the drive circuit depending on data exchanged via the data interface and/or depending on measurement values of the current sensor. Furthermore, the invention relates to an electronic switch comprising at least two switching modules of this type, wherein the switching modules are arranged in parallel in such a way that the semiconductor switches are arranged electrically in parallel and that a current through the electronic switch is divided among the semiconductor switches of the switching modules, wherein the data interfaces of the respective switching modifies are connected to one another, wherein the electronic switch is configured to control a division of the current through the electronic switch among the semiconductor switches by open-loop and/or closed-loop control by means of the drive circuits by changing the respective forward resistance of the semiconductor switches. The invention furthermore relates to a method for operating an electronic switch of this type.

What is claimed:

1. An electronic switch, comprising:
   at least two switching modules arranged in parallel, each said switching module comprising
   a semiconductor switch,
   a current sensor connected to the semiconductor switch and measuring a current flowing through the switching module,
   a data interface for connecting the at least two switching modules to one another, and
   a drive circuit configured to change a forward resistance of the semiconductor switch depending on data exchanged via the data interface and depending on current measurement values from the current sensor,
   wherein a current flowing through the electronic switch is divided among the semiconductor switches of the at least two switching modules by changing the forward resistance of the semiconductor switches via the drive circuits by open-loop and/or closed-loop control, and
   wherein the electronic switch is configured to synchronously switch the semiconductor switches of each switching module via the drive circuit and to operate the semiconductor switches in a linear region in a time range of 1 µs to 10 µs upon a change between ON and OFF and a change between OFF and ON in such a way that the current through the at least two switching modules is reduced in a controlled manner or is built up in a controlled manner.

2. The electronic switch of claim 1, wherein the electronic switch is configured to synchronously turn off the semiconductor switches.

3. The electronic switch of claim 1, wherein the semiconductor switch of the at least two switching modules is designed to turn off the current independently of a current flow direction through the switching module.

4. The electronic switch of claim 1, wherein the at least two switching modules are embodied structurally identically.

5. The electronic switch of claim 1, wherein the at least two switching modules differ in performance of the semiconductor switches thereof.

6. The electronic switch of claim 1, further comprising an asymmetric wiring configuration electrically connecting the at least two switching modules, wherein a line length for a connection of a first one of the at least switching modules is shorter than a line length of a second one of the at least two switching modules.

7. A method for operating an electronic switch including semiconductor switches of at least two switching modules arranged in parallel, said method comprising:
   controlling by open-loop and/or closed-loop control a forward resistance of the semiconductor switches depending on data exchanged via a data interface and depending on measurement values of current sensors of the at least two switching modules, such that a current through the electronic switch is divided among the semiconductor switches so that the semiconductor switches maximally carry a respective permissible current;
   synchronously switching the semiconductor switches via a drive circuit; and
   operating the semiconductor switches in a linear region in a time range of 1 µs to 10 µs upon a change between ON and OFF and a change between OFF and ON hi such a way that the current through the switching modules is reduced in a controlled manner or is built up in a controlled manner.

8. The method of claim 7, wherein the semiconductor switches are synchronously turned off via the drive circuit.

9. The method of claim 7, wherein a division of the current among the semiconductor switches is controlled by open-loop or closed-loop control in such a way that a capacity utilization of the semiconductor switches is identical.

10. The method of claim 9, wherein a semiconductor current through the semiconductor switches is identical.

11. The method of claim 7, further comprising determining and storing parameters required for a division of current.

12. The method of claim 7, further comprising using a model to calculate continuously the maximally permissible current carried by the semiconductor switches, with the model taking into consideration a power loss or a temperature of the semiconductor switch.

* * * * *

UNITED STATES PATENT AND TRADEMARK OFFICE
CERTIFICATE OF CORRECTION

PATENT NO. : 11,509,300 B2
APPLICATION NO. : 17/429893
DATED : November 22, 2022
INVENTOR(S) : Willi Böke and Markus Matthias Gaudenz It is certified that error appears in the above-identified patent and that said Letters Patent is hereby corrected as shown below:

On the Title Page
Under (30) Foreign Application Priority Data:
Replace "EP19157154" with the correct -- EP19157154.6 --.

In the Claims
In Column 10, Claim 7, Line 45:
Replace "hi" with -- in --.

Signed and Sealed this
Tenth Day of January, 2023

Katherine Kelly Vidal
*Director of the United States Patent and Trademark Office*